United States Patent [19]

McMaster

[11] Patent Number: 4,872,925
[45] Date of Patent: Oct. 10, 1989

[54] PHOTOVOLTAIC CELL FABRICATION METHOD AND PANEL MADE THEREBY

[75] Inventor: Harold A. McMaster, Woodville, Ohio

[73] Assignee: Glasstech, Inc., Perrysburg, Ohio

[21] Appl. No.: 114,683

[22] Filed: Oct. 29, 1987

[51] Int. Cl.$^4$ .................... H01L 27/14; H01L 31/18
[52] U.S. Cl. .................................. 136/244; 136/256; 136/258; 437/2; 437/4
[58] Field of Search ............... 437/2, 4, 51, 205; 136/244, 256, 258 AM

[56] References Cited

FOREIGN PATENT DOCUMENTS 60-149178  8/1985  Japan ..................................... 136/244
62-154788  7/1987  Japan ..................................... 136/244

*Primary Examiner*—Aaron Weisstuch
*Attorney, Agent, or Firm*—Brooks & Kushman

[57] ABSTRACT

A photovoltaic cell fabrication method and photovoltaic cell including a layer of amorphous silicon sandwiched between a transparent sheet electrode and a back sheet electrode. A third sheet electrode is insulated from the back sheet electrode and makes an electrical connection with the transparent sheet electrode at isolated areas by penetrating a dielectric layer which insulates the back and third sheet electrodes. The third sheet electrode also penetrates the back sheet electrode and the amorphous silicon layer at the isolated areas which, preferably, form an array of dots or point contacts with the transparent sheet electrode. The transparent sheet electrode is preferably disposed on a glass substrate and the point contacts result in an increase in the active area on the light incident surface of the cell. The frequent electrical connections of the third sheet electrode to the transparent sheet electrode result in lower power losses in the cell. The cell can be formed in a single, continuous production machine. A photovoltaic panel is made of a series of at least two of the cells wherein the third sheet electrode of one cell is serially connected to the back sheet electrode of an adjacent cell.

19 Claims, 3 Drawing Sheets

PHOTOVOLTAIC CELL FABRICATION METHOD AND PANEL MADE THEREBY

TECHNICAL FIELD

This invention relates to photovoltaic cell fabrication methods and cells and panels made thereby and, in particular, to such cells and panels which are capable of being produced in a single, continuous production machine while utilizing the method.

BACKGROUND ART

Photovoltaic cells for converting sunlight into electrical energy have been traditionally made of crystalline silicon. However, thin film amorphous silicon photovoltaic cells have been found to be more economically feasible from the standpoint of manufacturing costs. However, while more economically feasible than the production of crystalline silicon cells, the production of amorphous silicon cells is still quite costly.

One of the most important parameters in any resulting amorphous silicon cell is the amount of the active area of the cell which is exposed to the light. Typically, electrical connections which are necessary for the operation of the cell also block transmission of the light into the active portions of the cell. The electrical connections are generally opaque and are located between the light incident face of the cell and the active semiconductor material.

One prior art photovoltaic cell uses a plurality of point electrical contacts to a first electrode material layer which has been previously deposited onto a substrate. The point contacts are positioned in a spaced-apart relation across the surface of the substrate and extend through deposited semiconductor material. A plurality of individual pads are deposited adjacent to the deposited semiconductor material to form back electrodes. Each pad is electrically isolated from the other pads and the point contacts. First and second sets of interdigiting fingers electrically connect the point contacts and the pads, respectively. In this way, the bulk of the electrical connections are made on the back of the cell with only the point contacts in the front, resulting in an increased active area on the light incident surface of the cell.

However, electrical connections in and between such photovoltaic cells cannot be made quickly or inexpensively. Furthermore, such electrical connections should be of sufficiently low resistance to conduct electricity through and between the cells for maximum current collection. Problems arise in prior art photovoltaic cells and panels due to the relatively high power losses in thin wires or grids used for electrical connection.

DISCLOSURE OF THE INVENTION

An object of the present invention is to provide a photovoltaic cell fabrication method and photovoltaic cell and panel made thereby wherein improved electrical connections are manufactured quickly and inexpensively.

Another object of the present invention is to provide a photovoltaic cell fabrication method and photovoltaic cell and panel made thereby wherein many of such cells can be produced in a single, continuous production machine.

Yet still another object of the present invention is to provide a photovoltaic cell fabrication method and photoelectric cell and panel made thereby wherein improved electrical connections which take up little active area of the cell but which still have relatively low resistance are made.

In carrying out the above objects and other objects of the present invention a method for making a photovoltaic cell including a layer of semiconductor material sandwiched between first and second sheet electrodes is provided. The method includes the steps of making electrical connections to the first sheet electrode through the semiconductor. The connections are electrically insulated from the second sheet electrode. The improvement comprises making an array of openings in the second sheet electrode and the layer of semiconductor material to expose the first sheet electrode to permit the electrical connections to the first sheet electrode therethrough.

Further in carrying out the above objects and other objects of the present invention, a photovoltaic cell constructed in accordance with the present invention includes a substrate, a transparent first electrically conducting sheet electrode disposed on the substrate and a layer of photovoltaic semiconductor material disposed on and in continuous electrical contact with the first sheet electrode. The cell further includes a second electrically conducting sheet electrode disposed on and in continuous electrical contact with the semiconductor material layer and an electrically insulating dielectric layer disposed on the second sheet electrode. A third electrically conducting sheet electrode is disposed on the dielectric layer and is electrically insulated from the second sheet electrode. The layer of semiconductor material, the second sheet electrode and the insulating layer have openings at isolated areas. The third sheet electrode makes electrical contact with the first sheet electrode through the openings at the isolated areas.

A photovoltaic panel constructed in accordance with the present invention includes a series of such cells wherein the third sheet electrodes of one cell is serially connected to the second sheet electrode of an adjacent cell to add the voltages developed by the cells.

Preferably, the third sheet electrode is electrically insulated from the second sheet electrode at the isolated areas.

The advantages of the fabrication method, the photovoltaic cell and the photovoltaic panel as constructed above are numerous. For example, the electrical connections necessary for the operation of the photovoltaic cell may be produced in a continuous fashion in a mass production machine so that individual wires or grids need not be used. In this way, relatively low cost solar cells and panels result. Yet another benefit of such a photovoltaic cell and panel is that the cell and panel exhibit a high amount of reliability due to the lack of human-made electrical connections.

Other advantages of the present invention will be readily appreciated as the same become better understood by reference to the following detailed description when considered in connection with the accompanying drawings.

BEST MODE FOR CARRYING OUT THE INVENTION

Figure 1:
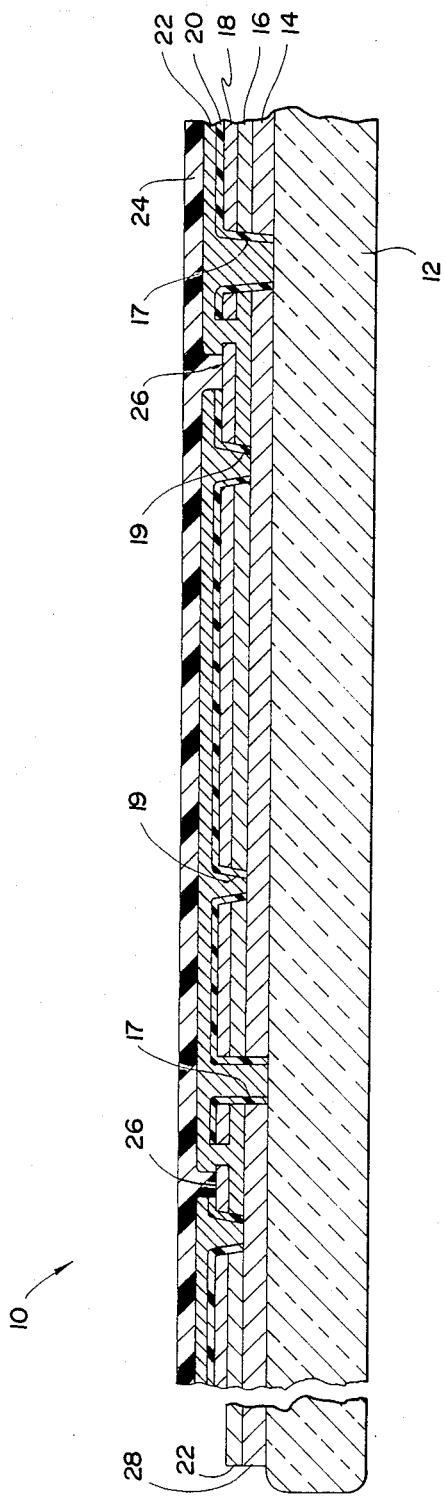
FIG. 1 is a side view, partially broken away and in cross-section, of a photovoltaic panel constructed in accordance with the present invention, illustrating individual cells and the electrical connections therebetween.

Referring now to the drawing figures, there is illustrated in FIG. 1 a photovoltaic panel, generally indicated at 10, which includes a plurality of interconnected photovoltaic cells. The photovoltaic panel 10 includes a substrate in a form of a glass substrate 12. However, it is to be understood that the substrate 12 may be selected from the group consisting of metals, plastics and ceramics.

On the top surface of the glass substrate 12 there is formed a first electrically conducting sheet electrode 14 in the form of a transparent conductive oxide layer. The transparent sheet electrode 14 may be selected from the group consisting of indium tin oxide, tin oxide, indium oxide, and zinc oxide.

A barrier layer of $SiO_2$ (not shown) is preferably disposed between the glass substrate 12 and the transparent sheet electrode 14.

A photovoltaic semiconductor layer 16 is disposed on and is in continuous electrical contact with the first sheet electrode 14. The semiconductor layer is preferably multiple layers of amorphous silicon. Included are first and second layers doped with P and N-charge carriers respectively and an intermediate layer of intrinsic amorphous silicon material.

A second electrically conducting sheet electrode or back sheet electrode 18 is disposed on and is in continuous electrical contact with the amorphous silicon layer 16. The second sheet electrode 18 is preferably made of multiple metallic layers including a thin layer of silver and a relatively thicker layer of copper deposited thereon (not shown for simplicity).

An electrically insulating dielectric polymer layer 20 is disposed on the back sheet electrode 18. The polymer is preferably of a type such as a gel-state polymer that can be screen-printed to various openings, including small circular openings and elongated lines.

A third electrically conducting sheet electrode 22 is disposed on the dielectric layer 20 and is thereby electrically insulated from the back sheet electrode 18. The third sheet electrode 22 is preferably also similarly composed of a combination of silver and copper layers. However, other conductive metallic elements or various alloys thereof could also be used.

An insulating encapsulating layer 24 is formed atop the third sheet electrode layer 22. The encapsulating layer 24 includes integrally formed, downwardly facing projections at isolation lines 26. The third sheet electrode 22 of one cell is serially electrically connected to the back sheet electrode 18 adjacent the isolation lines 26 of an adjacent cell to add the voltages developed by each of the serially interconnected cells.

Openings 19 are formed at isolated areas through the amorphous silicon layer 16, the back sheet electrode 18 and the dielectric layer 20. The third sheet electrode 22 makes electrical contact with the transparent sheet electrode 14 through the openings 19 at the isolated areas. Preferably, the isolated areas are rows of round dots. However, the isolated areas may alternatively be lines. The method of forming the openings 19 will be described in greater detail hereinbelow.

The amorphous silicon layer 16, the transparent sheet electrode 14, the back sheet electrode 18 and the dielectric layer 20 have openings 17 formed at isolation lines. The third sheet electrode 22 is disposed on and contacts the top surface of the glass substrate 12 through the openings 17 at the isolation lines. The third sheet electrode 22 is electrically insulated from the back sheet electrode 18 at the isolated openings 17 and 19 by the dielectric layer 20.

Preferably, the linear distance between any two openings 19 forming the dots is at least 10 times the diameter of any one of the dots.

Also, preferably, the sheet resistivity of the transparent electrode layer 14 is at least five times the sheet resistivity of any one of the back and third sheet electrodes 18 and 22, respectively.

At opposite ends of the panel 10 (only one of which is shown for convenience) busbars 28 are formed on the glass substrate 12. In turn, the third sheet electrode 22 is formed on the top surface of the busbars 28 as is described in detail hereinbelow. The busbars 28 are formed on the panel 10 to electrically connect the panel 10 in an electrical circuit.

Figure 2:
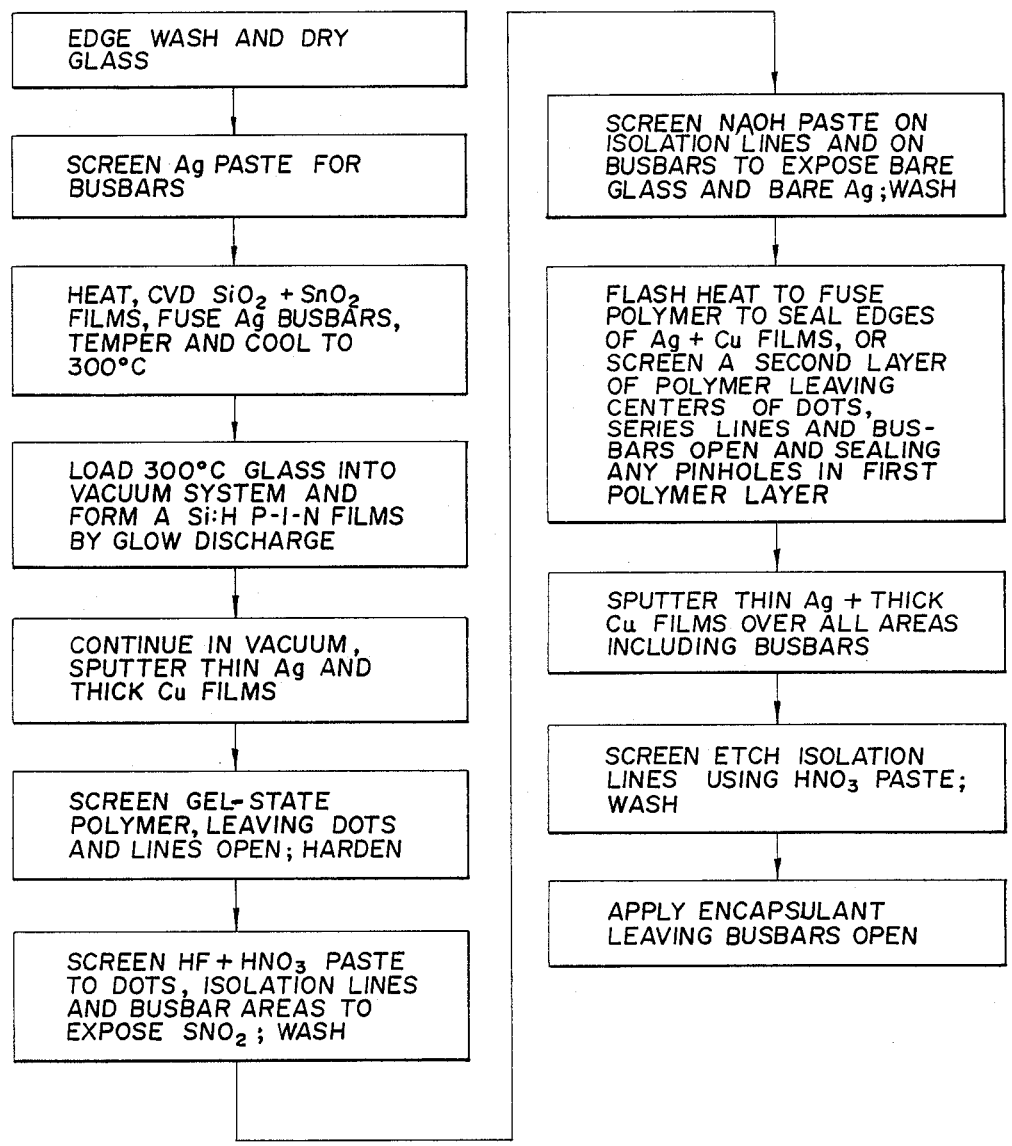
FIG. 2 is a block diagram illustrating the various process steps for constructing the photovoltaic panel of FIG. 1, and FIGS. 3A through 3D are cross-sectional views of the photovoltaic panel illustrating its structure at selected stages during fabrication.

Referring now to FIG. 2, there is illustrated in block diagram form, the preferred process steps in forming the structure of FIG. 1.

In the first step the glass substrate 12 is edge-washed and dried.

Figure 3A:
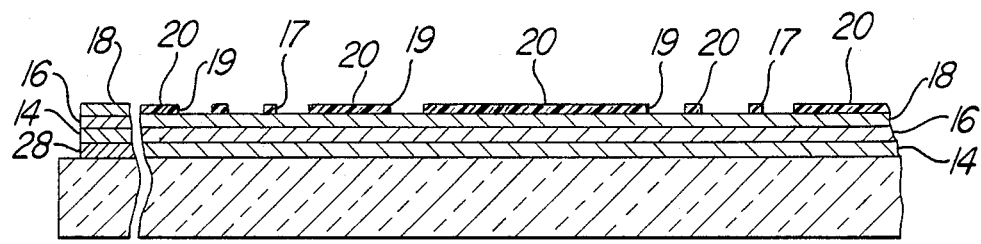

In the second step, silver paste is screened on the substrate 12 to form the busbars 28 as shown on FIG. 3A.

In the third step, $SiO_2$ and $SnO_2$ films are deposited by CVD on the heated substrate 12 including the busbars 28. The busbars 28 are fused. Then the resulting structure is tempered and cooled to 300 degrees C. to form the barrier layer (not shown) and the transparent sheet electrode 14.

In the fourth step, the still-heated glass substrate 12 is loaded into a vacuum system to form amorphous silicon P-I-N films by glow discharge, thereby forming the amorphous silicon layer 16.

In the fifth step, while in the vacuum, thin silver and thick copper films are deposited by sputtering to form the back sheet electrode 18.

In the sixth step, gel-state polymer is screened on the back sheet electrode 18 to form the dielectric layer 20. Dots and lines corresponding to the openings 17 and 19 are left open to produce the structure shown in FIG. 3A. Then the resulting structure is allowed to harden.

In the seventh step, HF and $HNO_3$ paste is screened in the openings 17 and 19 (i.e. the dots and isolation lines) and on the bus bars areas to expose the transparent sheet electrode 14. The resulting structure is then washed.

Figure 3B:
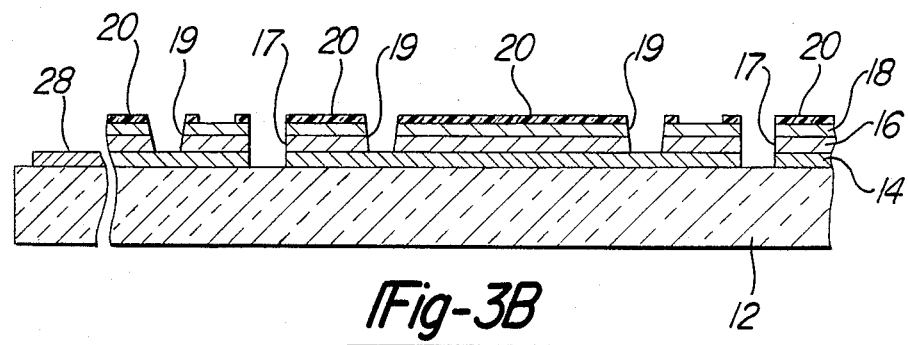

In the eighth step, NaOH paste is screened on the openings 17 forming the isolation lines and on the busbars 28 to expose the bare glass substrate 12 and the bare busbars 28, respectively to produce the structure shown in FIG. 3B. The resulting structure is again washed.

Figure 3C:
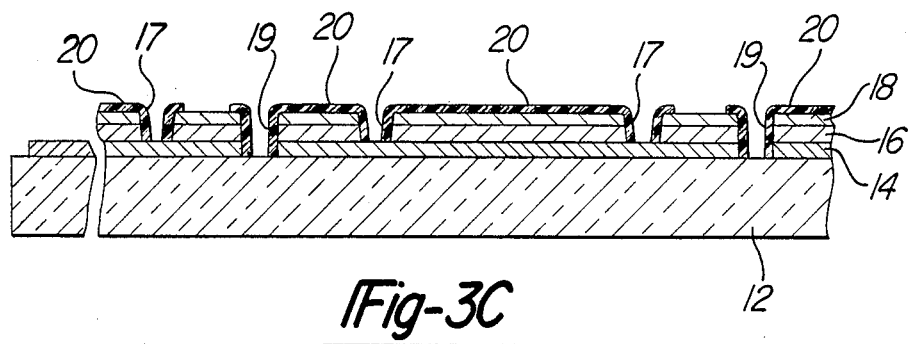

In the ninth step, the resulting structure is flash-heated to fuse the polymer of the dielectric layer 20 to seal the edges of the back sheet electrode 18 as shown in FIG. 3C. Alternatively, a second layer of polymer may be screened leaving the openings 17 forming the dots, the interconnecting series lines between the back and third sheet electrodes 18 and 22 (i.e. adjacent the isolation lines 26) and the bus bars 28 open and sealing any pin holes that may have developed in the first dielectric layer 20.

In the tenth step, a thin silver and a thick copper film are sputtered over all areas, including the busbars 28, to form the third sheet electrode 22.

Figure 3D:
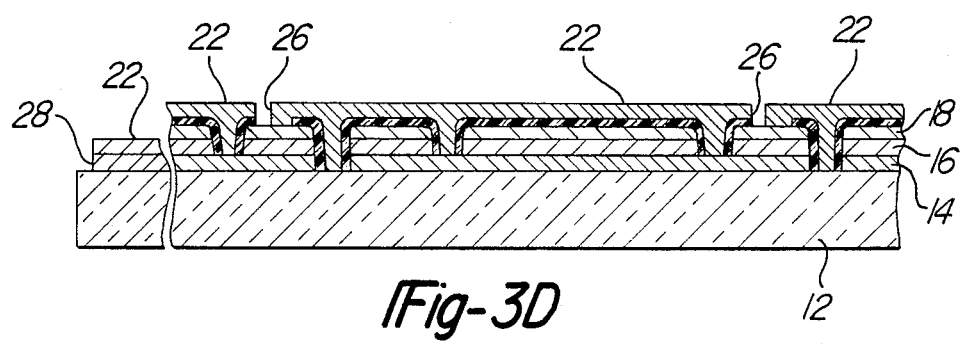
Figure 1:
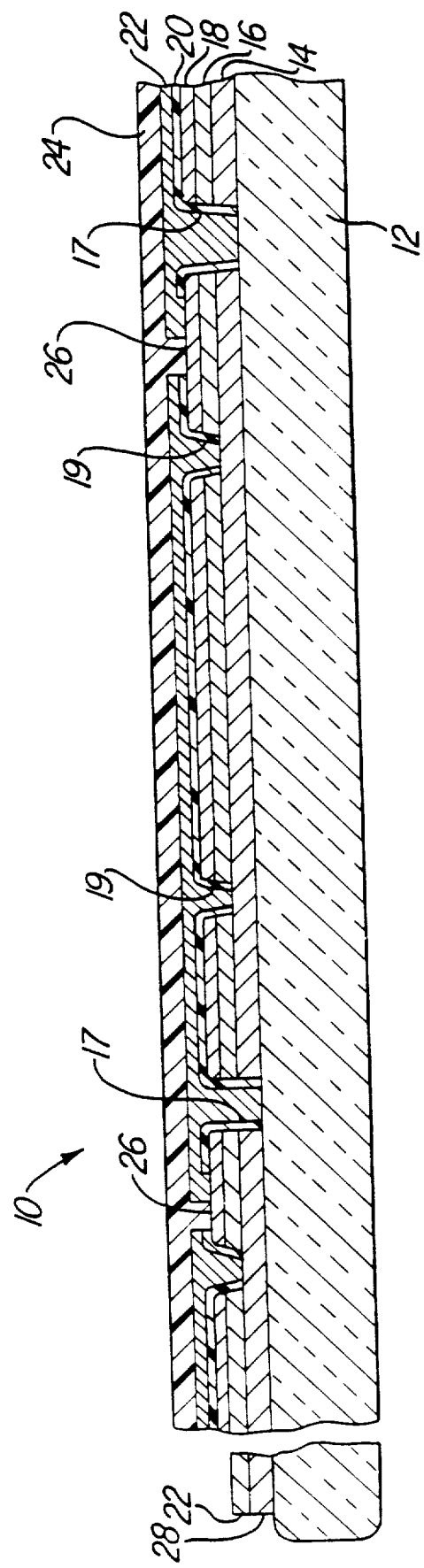

In the eleventh step, the isolation lines 26 are screen-etched in the dielectric layer 20 using NHO3 paste to produce the structure shown in FIG. 3D. The resulting structure is again washed.

Finally, in the twelfth step, encapsulant is applied to form the encapsulating layer 24 while leaving the busbars 28 open and forming the projections at the isolation lines 26 producing the photovoltaic panel shown in FIG. 1.

The panel 10 and its cells has numerous advantages. For example, the cells in the panel 10 can be quickly manufactured in an inexpensive and efficient fashion. Also, the electrical connections in the panel 10 can be produced in a single, continuous production machine without removing the substrate 12 from the machine for additional processing.

The present construction also eliminates resistance problems which have arisen in prior art photovoltaic cells due to thin wires and grids used for the electrical connections within and between cells. An added advantage of the present invention is the increased active area on the incident face of the panel 10. For example, the openings 19 allow a greater amount of light into the active area of the photovoltaic panel 10.

While the best mode for carrying out the invention has been described in detail, those familiar with the art to which this invention relates will recognize various alternative ways of practicing the present invention as defined by the following claims.

What is claimed is:

1. A photovoltaic panel including at least two serially connected photovoltaic cells comprising:
   a glass substrate:
   at least a first transparent electrically conductive sheet electrode disposed on said substrate;
   at least a second transparent electrically conductive sheet electrode disposed on said substrate spaced from and electrically isolated from said first transparent sheet electrode;
   at least one layer of photovoltaic semiconductor material disposed on each of said first and second transparent sheet electrodes and in continuous electrical contact therewith, each said layer of semiconductor material having at least one opening therethrough to expose a portion of the respective said first and second transparent sheet electrodes therethrough;
   a pair of electrically conductive sheet-like back electrodes, one disposed on each of said layers of semiconductor material to form two adjacent photovoltaic cells, each of said back electrodes having at least one opening therethrough mating said at least one opening through the respective layer of semiconductor material;
   a dielectric layer disposed on each of said back electrodes including the internal surface of said at least one opening therethrough, said dielectric layer disposed on a first of said two photovoltaic cells having an opening exposing its back electrode therethrough along the length of its edge adjacent to the second of said two photovoltaic cells;
   a vacuum deposited third electrically conductive sheet electrode disposed on said dielectric layer of said second photovoltaic cell and extending onto a portion of said first photovoltaic cell, said third sheet electrode electrically isolated from said back electrode of said second photovoltaic cell and electrically contacting said transparent sheet electrode thereof through said at least one opening through said layer of semiconductor material and said back electrode and electrically contacting said back electrode of said first photovoltaic cell through said opening through said dielectric layer; and
   means permitting electrical contact to said transparent sheet electrode of said first photovoltaic cell and said back electrode of said second photovoltaic cell.

2. The photovoltaic panel of claim 1 wherein said at least one opening through said layer of semiconductor material and said back electrode of each photovoltaic cell is a round dot.

3. The photovoltaic panel of claim 2, wherein said at least one opening through said layer of semiconductor material and said back electrode of each said photovoltaic cells is a plurality of openings in isolated areas of said transparent sheet electrode.

4. The photovoltaic panel of claim 1 wherein each of said first and second transparent sheet electrodes is a layer of a conductive oxide.

5. The photovoltaic panel of claim 4 wherein said layer of a conductive oxide is a layer of tin oxide.

6. The photovoltaic panel of claim 1 having a barrier layer disposed between said glass substrate and said transparent sheet electrode.

7. The photovoltaic cell of claim 1 wherein said at least one layer of semiconductor material is at least one layer of amorphous silicon.

8. The photovoltaic cell of claim 7 wherein said at least one layer of amorphous silicon comprises a first layer of amorphous silicon doped with a P-type charge carrier, a second layer of amorphous silicon doped with an N-type charge carrier and a third, intermediate, layer of intrinsic amorphous silicon.

9. The photovoltaic cell of claim 1 wherein said back electrode comprises a thin layer of silver and a thicker layer of copper.

10. The photovoltaic panel of claim 1 wherein said third sheet electrode comprises a first thin layer of vacuum deposited silver overlayed with a thicker second layer of vacuum deposited copper.

11. The photovoltaic panel of claim 1 comprising a plurality of photovoltaic cells having the same structure as said first and second photovoltaic cells and wherein said dielectric layer covers said back electrode of each of said plurality of photovoltaic cells and has an opening therethrough exposing said back electrode of each of said photovoltaic cells and wherein each photovoltaic cell has its own third sheet electrode disposed over said dielectric layer which electrically contacts the transparent electrode of its own photovoltaic cell through said at least one opening through its layer of semiconductor material and back electrode and contacts the back electrode of an adjacent photovoltaic cell.

12. A method for making a photovoltaic panel comprising the steps of:
   depositing a transparent sheet electrode on a surface of a glass substrate;
   depositing at least one layer of semiconductor material on and in electrical contact with said transparent sheet electrode;

depositing a sheet-like back electrode on and in electrical contact with said at least one layer of semiconductor material;
screen printing a gel-state polymer over said back electrode leaving firs isolation line openings, contact line openings, and dot openings in a predetermined geometrical pattern;
screen printing HF+HNO₃ paste into said first isolation line and said dot openings to etch first isolation lines and dots through said back electrode and said layer of semiconductor material to expose said transparent sheet electrode therethrough;
screen printing NaOH paste onto said transparent sheet electrode through said first isolation line openings to etch said first isolation lines through said transparent sheet electrode to form a plurality of discrete photovoltaic cells electrically separated from each other by said first isolation lines;
flash heating to fuse said gel-state polymer leaving the centers of said dots open and said contact line openings open while sealing the edges of the back electrode;
vacuum depositing a metal layer over said fused gel-state polymer to form a third electrically conductive sheet electrode electrically contacting said transparent sheet electrode of each photovoltaic cell through the open portion of said dots and electrically contacting the back electrode of each of said photovoltaic cells through said contact line openings; and
screen printing HNO₃ paste on said third electrode to etch a second set of isolation lines through said third sheet electrode, said second set of isolation lines electrically separating the portion of said third sheet electrode overlaying each photovoltaic cell electrically contacting said back electrode through said contact line openings from the portion of said third sheet electrode electrically contacting its associated transparent sheet electrode through the openings of said dots.

13. The method of claim 12 wherein said step of depositing a transparent sheet electrode, deposits a layer of a transparent conductive metal oxide.

14. The method of claim 13 wherein said layer of a conductive metal oxide is a layer of tin oxide.

15. The method of claim 12 wherein said at least one layer of semiconductor material is at least one layer of amorphous silicon.

16. The method of claim 15 wherein said at least one layer of amorphous silicon comprises a first layer of amorphous silicon doped with P-type carriers, a second layer of amorphous silicon doped with N-type carriers, and a third, intermediate, layer of intrinsic amorphous silicon.

17. The method of claim 12 wherein said step of depositing sheet-like back electrode comprises the steps of sequentially vacuum depositing a thin layer of silver and a thicker layer of copper.

18. The method of claim 12 wherein said metal layer forming third sheet electrode comprises layers of silver and copper sequentially deposited in a vacuum.

19. The method of claim 18 wherein said layers of silver and copper are deposited by sputtering.

* * * * *

UNITED STATES PATENT AND TRADEMARK OFFICE
CERTIFICATE OF CORRECTION

PATENT NO. : 4,872,925
DATED : October 10, 1989
INVENTOR(S) : Harold A. McMaster It is certified that error appears in the above-indentified patent and that said Letters Patent is hereby corrected as shown below:

The drawing sheeet, consisting of Figure 1, should be deleted to be replaced with the sheet of drawing, consisting of Figure 1, as shown on the attached page.

Signed and Sealed this

Twenty-sixth Day of October, 1993

*Attest:*

BRUCE LEHMAN

*Attesting Officer*    *Commissioner of Patents and Trademarks*